(12) United States Patent
Zamprogno et al.

(10) Patent No.: US 12,149,047 B2
(45) Date of Patent: Nov. 19, 2024

(54) PULSE WIDTH CHECK CIRCUIT FOR LASER DIODE PULSE GENERATOR

(71) Applicant: STMicroelectronics S.r.l., Agrate Brianza (IT)

(72) Inventors: Marco Zamprogno, Cesano Maderno (IT); Alireza Tajfar, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 298 days.

(21) Appl. No.: 17/833,604

(22) Filed: Jun. 6, 2022

(65) Prior Publication Data

US 2022/0302676 A1    Sep. 22, 2022

Related U.S. Application Data

(62) Division of application No. 16/455,063, filed on Jun. 27, 2019, now Pat. No. 11,387,625.

(51) Int. Cl.
*H01S 5/042* (2006.01)
*G02B 26/08* (2006.01)
*G02B 26/10* (2006.01)
*H01S 5/062* (2006.01)
*H03K 5/26* (2006.01)
*H05B 45/30* (2020.01)
*H05B 45/325* (2020.01)

(52) U.S. Cl.
CPC ........ *H01S 5/0428* (2013.01); *G02B 26/0816* (2013.01); *G02B 26/10* (2013.01); *H01S 5/062* (2013.01); *H03K 5/26* (2013.01); *H05B 45/30* (2020.01); *H05B 45/325* (2020.01)

(58) Field of Classification Search
CPC ...................................................... H01S 5/0428
USPC .............................................................. 327/31
See application file for complete search history.

(56) References Cited

U.S. PATENT DOCUMENTS

| | | | |
|---|---|---|---|
| 5,163,063 | A | 11/1992 | Yoshikawa et al. |
| 5,848,044 | A | 12/1998 | Taguchi et al. |
| 6,259,714 | B1 | 7/2001 | Kinbara |
| 6,417,738 | B1 | 7/2002 | Lautzenhiser |

(Continued)

OTHER PUBLICATIONS

Chen, Jie-Ting, et al: On-Chip ESD Protection Device for High-Speed I/O Applications in CMOS Technology, IEEE Transactions on Electron Devices, vol. 64, No. 10, Oct. 2017, 7 pgs.

*Primary Examiner* — Tomi Skibinski
(74) *Attorney, Agent, or Firm* — Crowe & Dunlevy LLC

(57) ABSTRACT

A pulsed signal generator generates a pulsed signal having a pulse width configured to be equal to a given fraction of a pulse width of a reference clock. A reference current source outputs current having a reference magnitude, and a comparison current source outputs current having a magnitude that is a function of the reference magnitude and the given fraction. A comparison circuit compares a total current output by one of the reference current source and the comparison current source during pulses of the reference clock to a total current output by the other of the reference current source and the comparison current source during pulses of the pulsed signal equal in number to the pulses of the reference clock in order to determine whether the pulse width of the pulse signal is less than or equal to the given fraction of the pulse width of the reference clock.

21 Claims, 10 Drawing Sheets

(56) References Cited

U.S. PATENT DOCUMENTS

| | | | |
|---|---|---|---|
| 6,771,133 B2 | 8/2004 | Lautzenhiser | |
| 6,819,612 B1 | 11/2004 | Achter | |
| 7,298,173 B1 | 11/2007 | Jiang et al. | |
| 8,441,293 B2 * | 5/2013 | Wang | H03K 7/08 |
| | | | 327/170 |
| 10,291,192 B1 | 5/2019 | Casey et al. | |
| 2003/0001637 A1 | 1/2003 | Jung | |
| 2003/0012321 A1 | 1/2003 | Tokutome et al. | |
| 2003/0200518 A1 | 10/2003 | Saeki | |
| 2003/0201812 A1 | 10/2003 | Suzuki | |
| 2005/0243879 A1 | 11/2005 | Horiuchi et al. | |
| 2007/0188206 A1 | 8/2007 | Lee | |
| 2011/0043269 A1 | 2/2011 | Nishijima et al. | |
| 2011/0064098 A1 | 3/2011 | Omori et al. | |
| 2012/0008342 A1 | 1/2012 | Hsu et al. | |
| 2012/0049829 A1 | 3/2012 | Murakami | |
| 2012/0154001 A1 | 6/2012 | Seo | |
| 2014/0203854 A1 | 7/2014 | Jung et al. | |
| 2015/0097604 A1 | 4/2015 | Taniguchi | |
| 2016/0173109 A1 | 6/2016 | Montoriol et al. | |
| 2018/0278017 A1 | 9/2018 | Mignoli et al. | |
| 2018/0323576 A1 | 11/2018 | Crawford et al. | |
| 2020/0395734 A1 * | 12/2020 | Asuncion | H01S 5/042 |

\* cited by examiner

PULSE WIDTH CHECK CIRCUIT FOR LASER DIODE PULSE GENERATOR

RELATED APPLICATION

This application is a division of U.S. patent application Ser. No. 16/455,063, filed Jun. 27, 2019, the contents of which are incorporated by reference in their entirety to the maximum extent allowable under the law.

TECHNICAL FIELD

This application is directed to the field of laser driving, and in particular, is directed to a circuit for verifying that the pulse width of pulses, based upon which a laser diode is driven, is a desired pulse width.

BACKGROUND

Augmented reality is a technology whereby live direct or indirect views of the physical real world are augmented with superimposed computer-generated images. For example, augmented reality technology may be incorporated into a headset worn by a user so that the computer-generated images are superimposed over the user's view of the real world. The computer-generated images may be information about the real world (e.g., the name of a landmark), information relative to the user's own life (e.g., a reminder of an upcoming appointment), etc.

Some augmented reality headsets involve the use of picoprojectors that scan RGB lasers across separate screens for each eye in scan patterns at a rate sufficient to form viewable images. Precise control of laser power and pulse width is of concern for this type of augmented reality headset to ensure proper functionality and that images appear as intended.

Other augmented reality headsets involve the use of picoprojectors that scan RGB lasers across each eye in scan patterns at a rate sufficient such that the eyes perceive images. Precise control of laser power and pulse width is of particular concern for this type of augmented reality headset in order to avoid causing discomfort to the user's eyes.

While techniques for precisely controlling laser power exist, there remains a need for techniques for precisely controlling laser pulse width. As such, there has been a need for further development in this area.

SUMMARY

A circuit disclosed herein includes a pulsed signal generator generating a pulsed signal having a pulse width configured to be equal to a given fraction of a pulse width of a reference clock, a reference current source outputting current having a reference magnitude, and a comparison current source outputting current having a magnitude that is a function of the reference magnitude and the given fraction.

The pulsed signal generator also includes a comparison circuit configured to receive the pulsed signal and to compare a total current output by one of the reference current source and the comparison current source during a plurality of pulses of the reference clock to a total current output by the other of the reference current source and the comparison current source during a plurality of pulses of the pulsed signal equal in number to the plurality of pulses of the reference clock. The comparison circuit then determines whether the pulse width of the pulse signal is less than or equal to the given fraction of the pulse width of the reference clock based upon the comparison.

The pulse width of the pulsed signal being less than or equal to the given fraction of the pulse width of the reference clock indicates proper operation of the pulsed signal generator. The pulse width of the pulsed signal being greater than the given fraction of the pulse width of the reference clock indicates improper operation of the pulsed signal generator.

As a non-limiting implementation example, the circuit may include a laser driver configured to generate a laser drive current based upon the pulsed signal, and a laser diode driven by the laser drive current so as to produce a laser. In this non-limiting implementation example, the circuit may also include a movable mirror apparatus configured to reflect the laser in a scan pattern at a rate sufficient to produce an image viewable by a human eye.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1A:
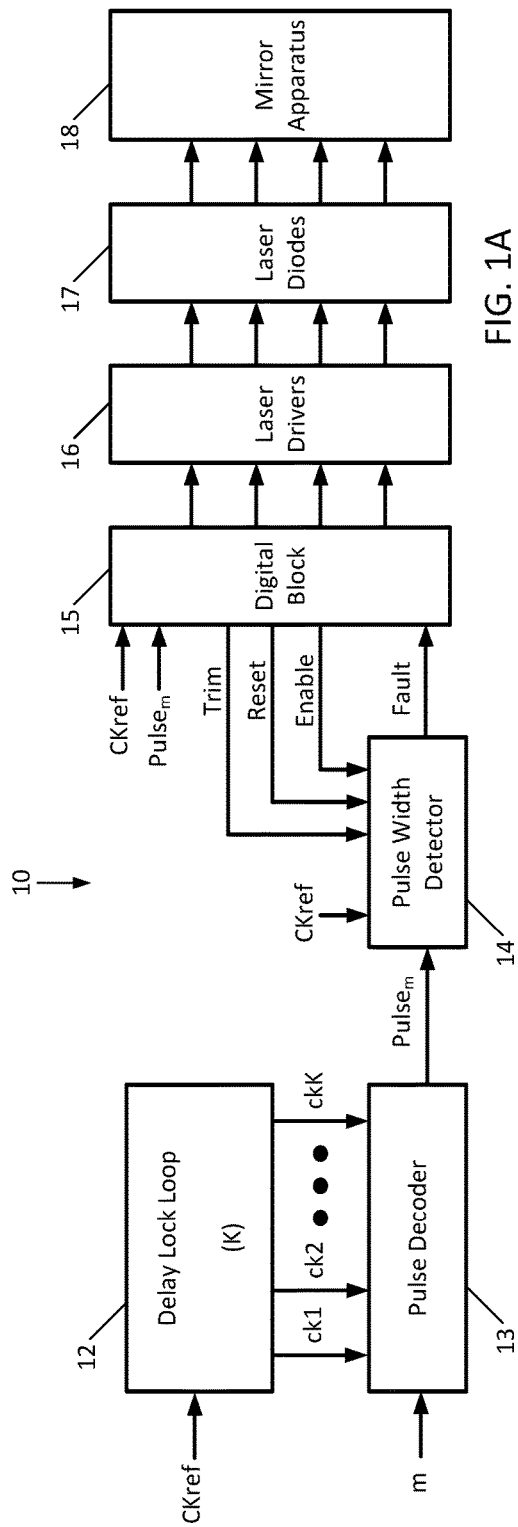
FIG. 1A is a block diagram of picoprojector including a laser system with a pulse width check circuit in accordance with this disclosure.
Figure 1B:
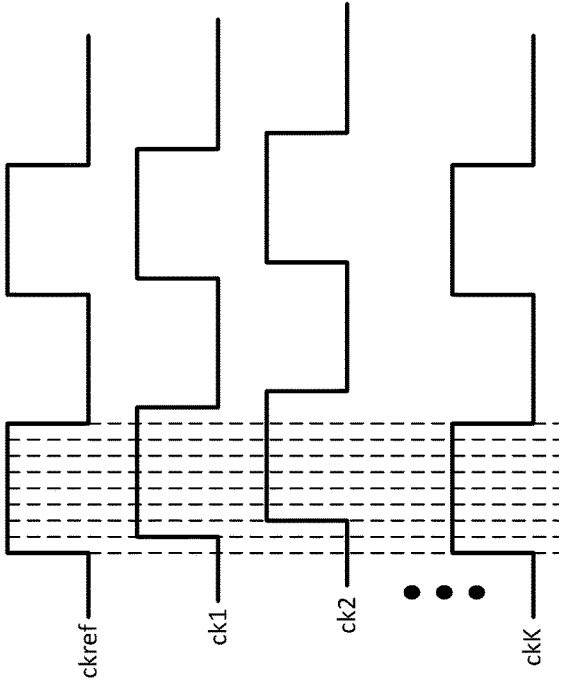
FIG. 1B is a graph showing the reference clock (CKref), and the delayed versions (ck1, . . . , ckK) of the reference clock produced by the delay lock loop of FIG. 1A.

A picoprojector 10 is now described with initial reference to FIG. 1A. The picoprojector 10 includes a delay lock loop (DLL) 12 that receives a reference clock CKref, and outputs a number K of delayed versions of the reference clock CKref, each being increasingly delayed by 1/K of the period of CKref. This is illustrated in FIG. 1B, showing the reference clock CKref, and the K delayed versions ck1, ..., ckK of the reference clock produced by the DLL. For this example, K is 8 (but can be any integer), and it can therefore be seen that ck1 is delayed by ⅛ of the period of CKref, ck2 is delayed by ⅔ of the period of CKref, and so on, until ckK (ck8) is delayed by a full period of CKref.

A pulse decoder 13 receives the delayed versions ck1, ..., ckK of the reference clock from the DLL as input, as well as an input code m, and produces a pulsed output signal $Pulse_m$ having a pulse width of m/K and a fixed position within the period of the reference clock CKref. Therefore, through the selection of the value of m, the pulse width of the pulsed output signal $Pulse_m$ and its position within the period of the reference clock CKref are selected.

A digital block 15 receives the reference clock CKref and the pulsed output signal $Pulse_m$, and based upon the pulsed output signal $Pulse_m$, provides output signals to laser drivers 16 that drive laser diodes 17. The laser diodes 17, when driven, produce lasers (e.g., RGB lasers) that impinge upon a mirror apparatus 18 that reflects the lasers in desired scan patterns to form images.

A pulse width detector 14 receives the pulsed output signal $Pulse_m$ from the pulse decoder 13, and asserts an output signal Fault if the pulsed output signal $Pulse_m$ has a pulse width greater than desired.

The digital block 15 also receives the Fault signal, and takes appropriate corrective action based upon assertion of the Fault signal (e.g., altering the output signals to the laser drivers to cause them to not drive the laser diodes 17, or waiting for multiple assertions of the Fault signal before taking such action). The digital block 15 provides the Reset and Enable signals used to control operation of the pulse width detector 14, and optionally provides a trimming signal Trim to the pulse width detector 14 that can be used to adjust operation of the pulse width detector 14 to account for differences in process, temperature, and frequency of the reference clock.

The pulse width detector 14 is now described with reference to FIG. 2A. First, the structure of the pulse width detector 14 will be described, and then the operation of the pulse width detector 14 will now described.

The pulse width detector 14 includes a current source 21 connected between a supply node VDD and a node N1, a switch S1 connected between the node N1 and a node N2, and a current source 22 connected between the node N2 and ground. The current source 21 sources a current Iref to node N1, while the current source 22 sinks a current IPulse from node N2. Switch S1 is controlled by the $Pulse_m$ signal (e.g., closes when $Pulse_m$ is high, and opens when $Pulse_m$ is low).

An inverter 23 has its input connected to node N1 to receive the $Sense_{in}$ signal, and its output provides a $Sense_{out}$ signal from which the Fault flag is generated. An integration capacitor C is connected between the node N1 and ground. A switch S2 connects the input of the inverter 23 to the output of the inverter 23, and is controlled by the Reset signal (e.g., closes when Reset is high, and opens when Reset is low).

A switch S3 is connected between the node N2 and a node N3, and is controlled by an inverse of the $Pulse_m$ signal (e.g., closes when $Pulse_m$ is low, and opens when $Pulse_m$ is high). An inverter 24 has its input connected to node N3 and its output provides a reference signal ref. A switch S4 connects the input of the inverter 24 to the output of the inverter 24, and is controlled by the Enable signal (e.g., opens when Enable is high and closes when Enable is low).

Operation of the pulse width detector 14 will now be described. It is noted that the Enable signal remains high, and therefore the switch S4 remains closed, during operation.

Operation proceeds in two phases, namely reset and sensing. In general, the purpose of the reset phase is to set the input and output of the inverter 23 to the threshold voltage of the inverter 23, so that later, when the reset phase ends and the sensing phase begins, a slight change in the voltage Sense will cause the output $Sense_{out}$ of the inverter 23 to quickly rise to VDD or quickly fall to GND. In general, the purpose of the sensing phase is to cause Sense to rise over time if the pulse width of $Pulse_m$ is equal to m/K of the period of the reference clock CKref (resulting in a falling of the $Sense_{out}$ signal), but to fall over time if the pulse width of $Pulse_m$ is greater than m/K of the period of the reference clock CKref (resulting in a rising of the $Sense_{out}$ signal); since a slight change in Sense will result in a quick change in $Sense_{out}$, by monitoring $Sense_{out}$ during the sensing phase, it is quickly known whether or not the pulse width of $Pulse_m$ is equal to m/K of the period of the reference clock CKref. If the pulse width of $Pulse_m$ is equal to m/K of the period of the reference clock CKref, then the delay lock loop 12 and pulse decoder 13 are operating properly; if the pulse width of $Pulse_m$ is greater than m/K of the period of the reference clock CKref, then the delay lock loop 12 and pulse decoder 13 are operating in a faulty condition.

In greater detail, during the reset phase, the Reset signal is asserted, closing switch S2, shorting the input and output of the inverter 23, and charging the capacitor C to the threshold voltage of the inverter 23.

Figure 2A:
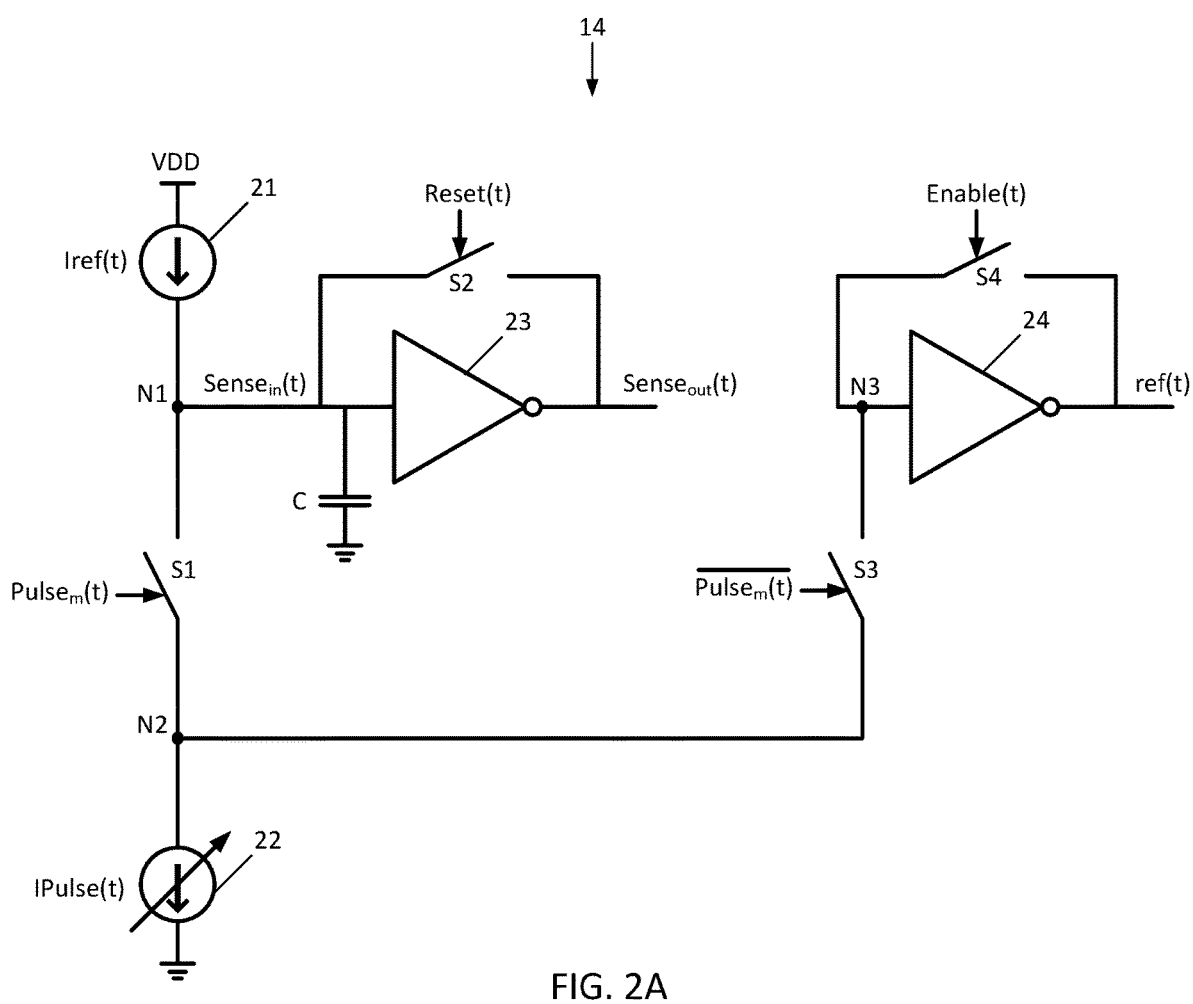
FIG. 2A is a schematic block diagram of a first embodiment of the pulse width check circuit of FIG. 1A.
Figure 2B:
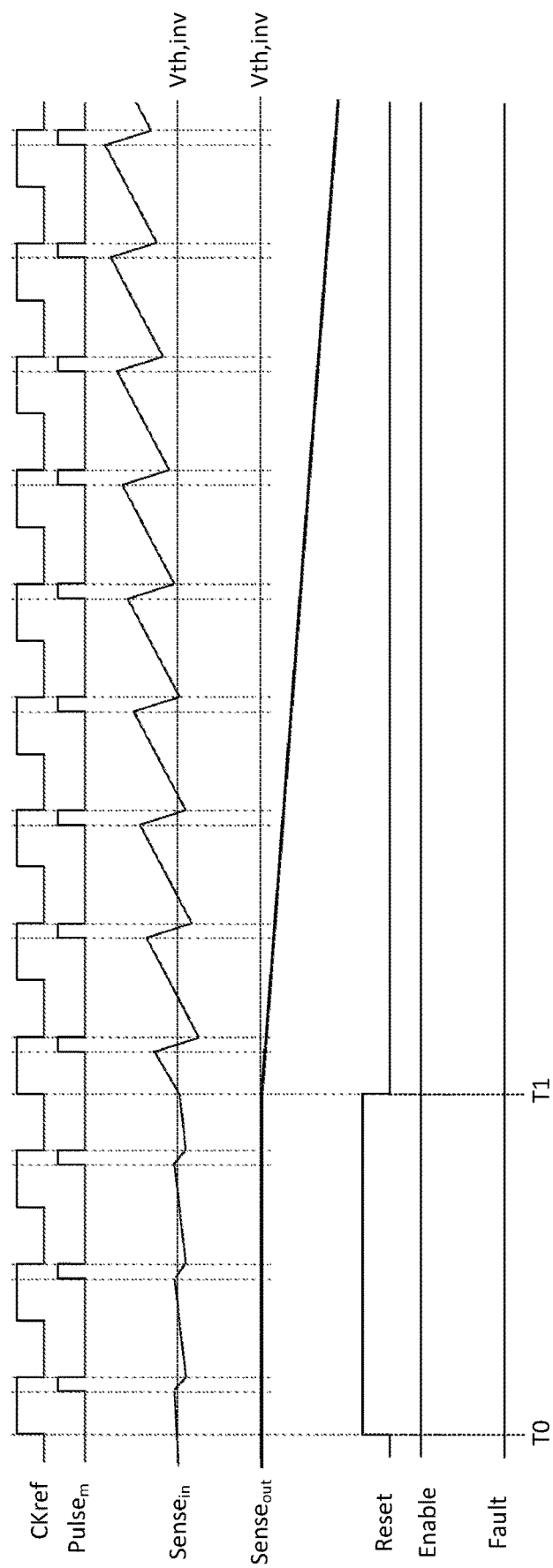
FIG. 2B is a timing diagram showing operation of the pulse width check circuit of FIG. 2A during a lack of detection of a pulse width error.

This function of the reset phase can be seen in FIG. 2B. At time T0, the Reset signal goes high, closing switch S2, and beginning the reset phase. As can be seen, $Sense_{in}$ and $Sense_{out}$ are then substantially equal to the threshold voltage of the inverter 23. Although in the graphs shown, $Sense_{in}$ and $Sense_{out}$ are equal in voltage upon assertion of the Reset signal at T0, in some cases this may not be the case, and they may only become equal after a sufficient number of cycles of the reference clock CKref (and therefore the pulsed signal $Pulse_m$).

As can be readily appreciated, the $Pulse_m$ signal continues to pulse during both the reset and sensing phases, and therefore the switches S1 and S3 continue to open and close opposite on phase to one another during both the reset and sensing phases. The function of the inverter 24 is to maintain the voltage biasing across the current source 22 at substantially a same level when switch S1 is open as when switch S1 is closed. In fact, the voltage produced by the inverter 24 is intended to be substantially similar to $Sense_{in}$. Therefore, during the reset phase, the inverter 23 (with its input and output shorted by switch S2) is sufficiently less sensitive to charge injected by the current generators 21 and 22 to not switch off those current generators 21 and 22. As an alternative, during the reset phase, the current generators 21 and 22 can either be switched off, or arranged so as to not source/sink their respective currents to the inverter 23. Either way, the operation to be performed is to not disturb the reset phase, allowing the inverter 23 to be set to exactly its threshold voltage.

The sensing phase will now be described. Once the reset phase is complete, the Reset signal goes low, beginning the sensing phase and opening the switch S2. Operation during a single pulse of the reference clock CKref is described below, with it being understood that $Pulse_m$ is intended to be low for a time equal to 1−(m/K) of the period of CKref, and high for a time equal to m/k of the period of CKref. The verification of this condition is, as described, the purpose of the pulse width detector 14.

When $Pulse_m$ is low, switch S1 remains open, and the current Iref begins to charge the capacitor C. When $Pulse_m$ is high, switch S1 closes. The magnitude of IPulse is intended to be slightly less than Iref*(K/m) (e.g., by an amount equal to the Trim current), so that if switch S1 closes for a time equal to m/K of the period of CKref, the sinking of the current IPulse is insufficient to fully discharge from the capacitor C the charge that had been added to the capacitor C by Iref while $Pulse_m$ was low; conversely, if the switch S1 closes for a time greater than m/K of the period of CKref, the sinking of Ipulse is sufficient to discharge from the capacitor C more charge than had been added to the capacitor by Iref while $Pulse_m$ was low.

Therefore, provided that the pulse width of $Pulse_m$ is actually m/K of the pulse width of the reference clock CKref as intended, during each pulse of the reference clock CKref, the capacitor C gains charge (and thus the magnitude of the Sense voltage rises). Since the input and output of the inverter 23 were set to the threshold of the inverter 23 during the reset phase, this increase in the voltage of Sense quickly results in the inverter 23 pulling $Sense_{out}$ to ground.

This operation (in the case where the pulse width of $Pulse_m$ is m/K of the pulse width of the reference clock CKref as intended) can be seen in FIG. 2B. At time T1, the reset phase ends and the sensing phase begins, and it can be seen that Sense rises while $Pulse_m$ is low and falls while $Pulse_m$ is high, however, the average value of Sense rises over time, and accordingly, $Sense_{out}$ quickly falls to ground, indicating that $Pulse_m$ is being properly generated.

However, as stated, if the pulse width of $Pulse_m$ is greater than m/K of the pulse width of the reference clock CKref, during each pulse of the reference clock CKref, the capacitor C loses charge (and thus the magnitude of the Sense voltage lowers). Since the input and output of the inverter were set to the threshold of the inverter 23 during the reset phase, this decrease in the voltage of Sense quickly results in the inverter 23 pulling $Sense_{out}$ to VDD.

Figure 2C:
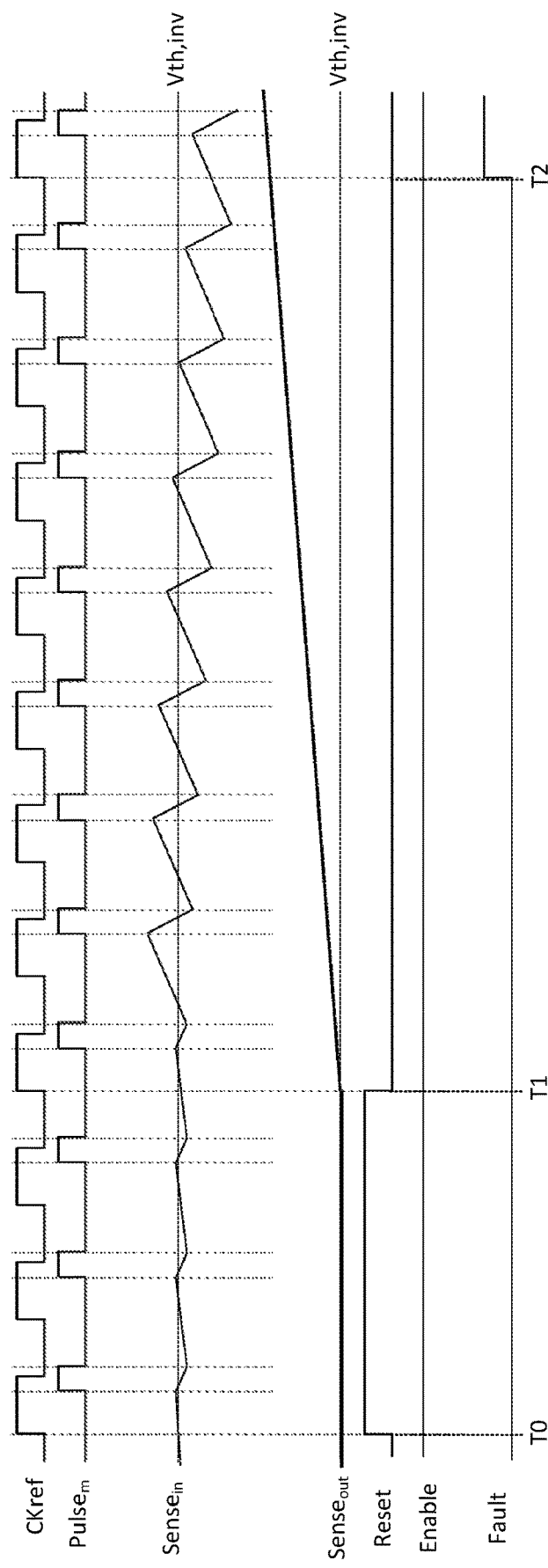
FIG. 2C is a timing diagram showing operation of the pulse width check circuit of FIG. 2A during detection of a pulse width error.

This operation (in a case where the pulse width of $Pulse_m$ is greater than m/K of the pulse width of the reference clock CKref) can be seen in FIG. 2C. At time T1, the reset phase ends and the sensing phase begins, and it can be seen that $Sense_m$ rises while $Pulse_m$ is low and falls while $Pulse_m$ is high, however, the average value of $Sense_m$ falls over time, and accordingly, $Sense_{out}$ quickly rises to VDD, indicating that the pulse width of $Pulse_m$ is greater than m/K of the pulse width of the reference clock CKref, and that an error or fault has occurred. Thus, at time T2, the Fault flag transitions high.

Figure 3A:
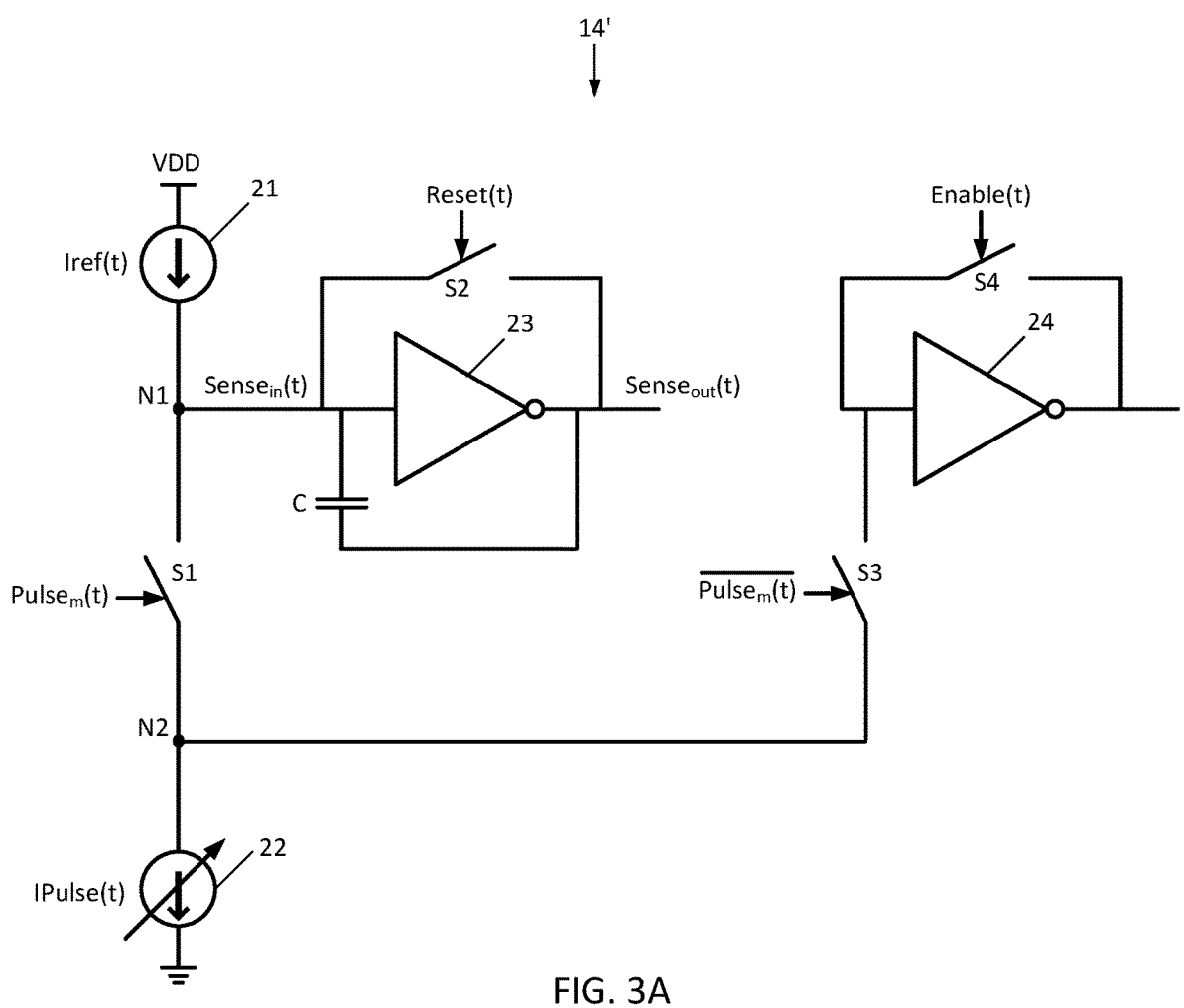
FIG. 3A is a schematic block diagram of a second embodiment of the pulse width check circuit of FIG. 1B.

Note that although in FIG. 2A, the capacitor C is connected between node N1 and ground, in some cases, it may be connected between the input and output of the inverter 23, as shown in FIG. 3A. This slightly alters the reset phase. In FIG. 3A, during the reset phase, the Reset signal is asserted, closing switch S2, shorting the input and output of the inverter 23 and discharging the capacitor C across the input and output of the inverter 23. The reset phase is performed for a sufficient number of cycles of the reference clock CKref (and therefore the pulsed signal $Pulse_m$) to sufficiently discharge the capacitor as described to set the voltage of the input and output of the inverter 23 to both be at the threshold voltage of the inverter (e.g., the voltage at which any increase or decrease will quickly result in the output of the inverter 23 rising to VDD or falling to ground).

After each iteration of the sense phase, the reset phase is returned to. The time between two reset phases is generally fixed. In greater detail, according to the sizing of Iref, IPulse, and Trim, as well as m and K, a maximum time (in term of clock periods) needed to lead to a fault condition or a known non-fault condition is defined. After this defined time, the reset phase is performed. The number of pulses of the reference clock CKref used for the reset phase is dependent to the time to discharge the capacitor C, and is therefore related to both the capacitance of the capacitor C and the size of the inverter 23.

Figure 4A:
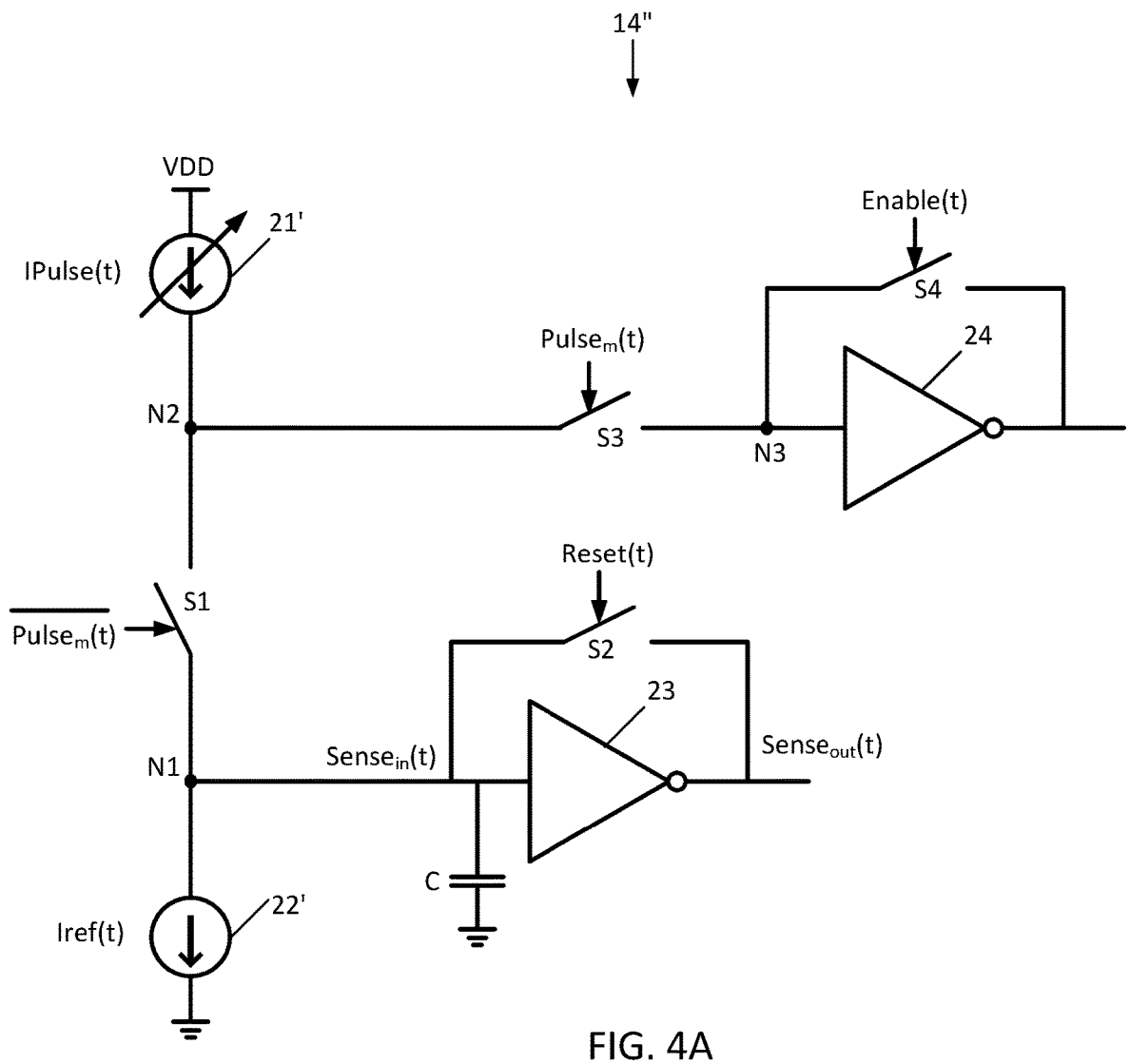
FIG. 4A is a schematic block diagram of a third embodiment of the pulse width check circuit of FIG. 1B.

In the examples given above, the current Iref output by the current source 21 is fixed, with the current IPulse output by the current source 22 being dependent on m/K; however, it is possible for the converse to be true, and for Iref to be output by the current source 22' and IPulse to be output by the current source 21'; such an implementation is shown in FIG. 4A.

In this implementation, the current source 21' sources IPulse to node N2, while the current source 22' sinks Iref from node N1. Nodes N2 and N1 are selectively coupled by switch S1 in response to the complement of the $Pulse_m$ signal (with switch S1 being closed when $Pulse_m$ is low and open with $Pulse_m$ is high). Nodes N2 and N3 are selectively coupled by switch S3, which is also controlled by the $Pulse_m$ signal (with switch S3 being open when $Pulse_m$ is low and being closed when $Pulse_m$ is high). The inverter 24 receives input from node N3, and has its input and output selectively shorted by switch S4 in response to the Enable signal. The inverter 23 receives input from node N1 at which the $Sense_m$ voltage is generated, and provides the $Sense_{out}$ voltage as output. The inverter 23 has its input and output selectively shorted by switch S2 in response to the Reset signal. The capacitor C is coupled between node N1 and ground.

Regarding operation, during the reset phase, the Reset signal is asserted, closing switch S2, shorting the input and output of the inverter 23, and charging the capacitor C to the threshold voltage of the inverter 23, thereby setting the input and output of the inverter 23 to its threshold voltage. The purpose of the switch S3 operating opposite in phase to the switch S1 is to maintain the voltage biasing across the current source 21 at substantially a same level when switch S1 is open as when switch S1 is closed. In the sensing phase, the Reset signal goes low, beginning the sensing phase and opening the switch S2.

The magnitude of IPulse is intended to be slightly greater than (Iref)/(1−m/K) (e.g., by an amount equal to the Trim current), so that if switch S1 closes for a time equal to 1−(m/k) of the period of CKref, the sourcing of the current IPulse to the capacitor C during that time is sufficient to charge the capacitor C and therefore greater than total discharge of charge from the capacitor C by Iref during the pulse of CKref. This condition indicates that the pulse width of $Pulse_m$ is actually m/K (or less than m/K) of the pulse width of the reference clock CKref as intended.

Conversely, if the switch S1 opens for a time greater than m/K of the period of CKref, the sourcing of the current Ipulse to the capacitor C during 1−(m/k) of the period of CKref will have been insufficient for the capacitor to not become fully discharged by Iref during the pulse of CKref. This condition indicates that the pulse width of $Pulse_m$ is greater than m/K of the pulse width of the reference clock CKref, as is sought to be avoided, as described above.

In the cases described above, the arrangement and magnitudes of current sources 21 and 22, as well as which of switches S1 and S3 is driven by $Pulse_m$ and which of switches S1 and S3 is driven by the complement of $Pulse_m$, have been selected so that when Pulse$_m$ has a pulse width equal to or less than m/k of the pulse width of CKref, Sense$_m$ will rise and Sense$_{out}$ will fall. However, it should be understood that the core concept described above is the comparison between Iref and Ipulse to determine whether the pulse width of Pulse$_m$ is equal to or less than m/k of the pulse width of CKref (which indicates proper operation), or whether the pulse width of Pulse$_m$ is greater than m/k of the pulse width of CKref (which indicates improper operation). Therefore, the specific arrangement and magnitudes of current sources 21 and 22, as well as which of switches S1 and S3 is driven by Pulse$_m$ and which of switches S1 and S3 is driven by the complement of Pulse$_m$, may be arranged in any which way where the result is that whether the pulse width of Pulse$_m$ is equal to or less than m/k of the pulse width of CKref can be determined.

Figure 2D:
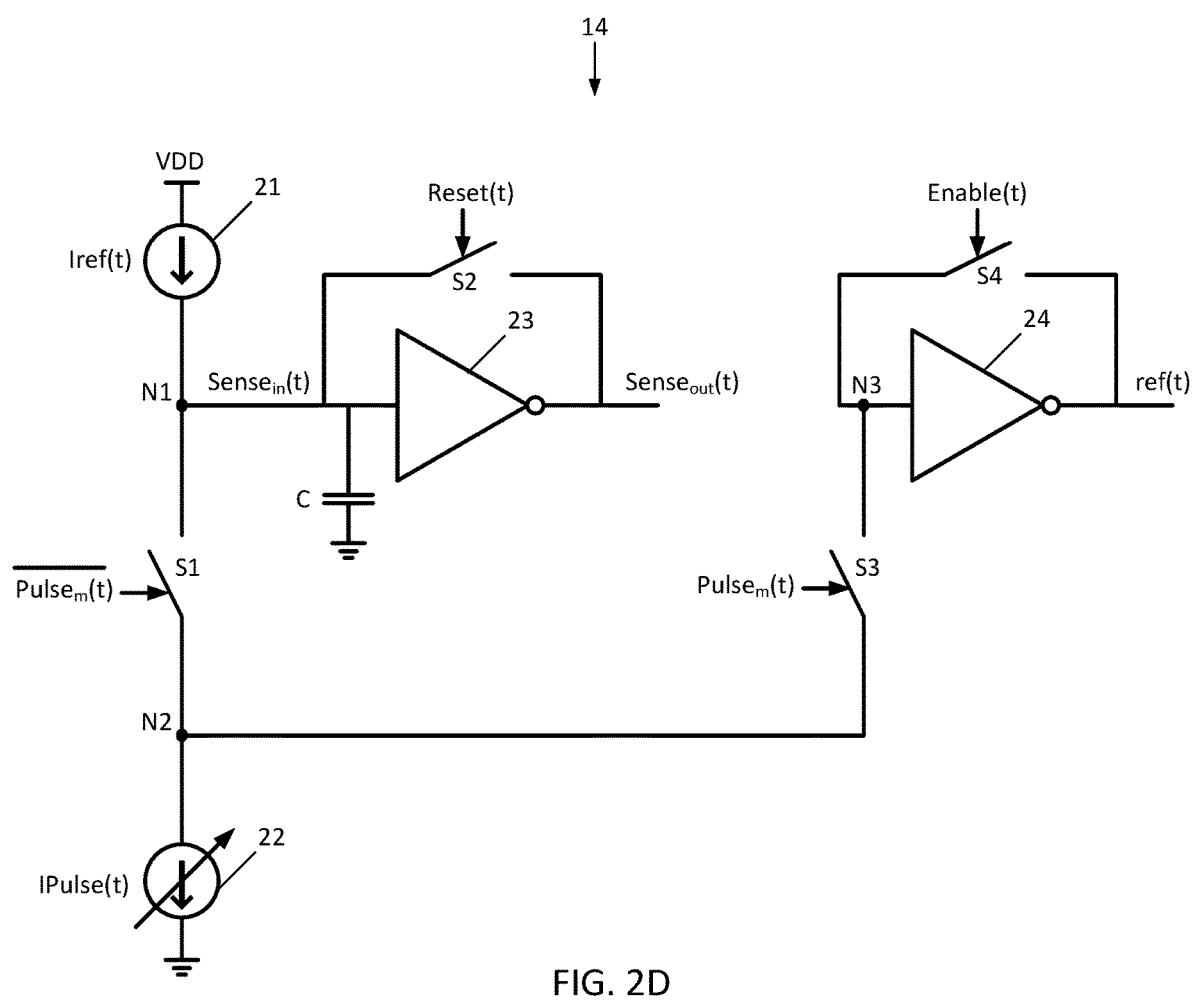
FIG. 2D is a schematic block diagram of the first embodiment of the pulse width check circuit of FIG. 2A in which the driving of switches S1 and S3 has been reversed.
Figure 3B:
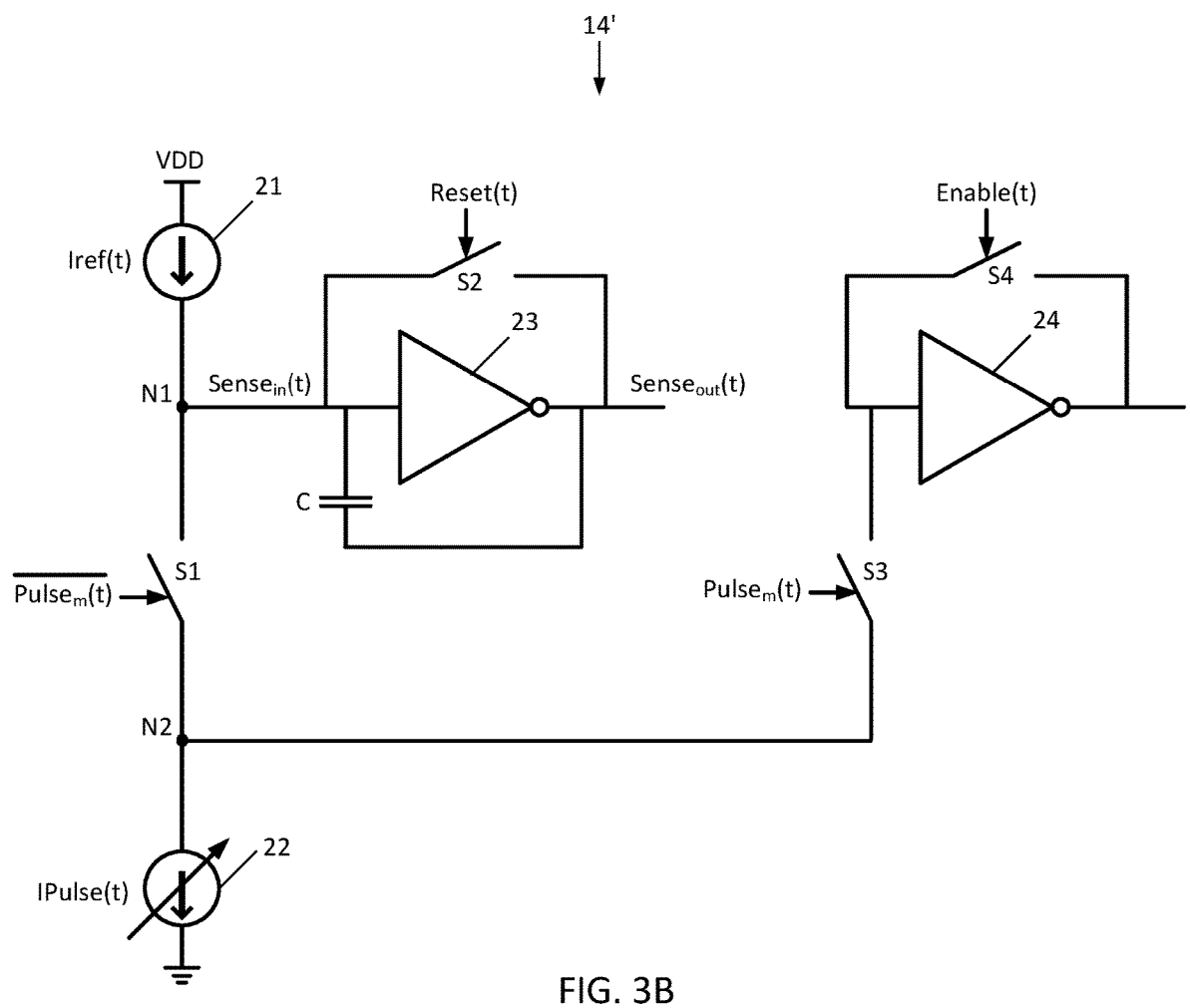
FIG. 3B is a schematic block diagram of the second embodiment of the pulse width check circuit of FIG. 3A in which the driving of switches S1 and S3 has been reversed.

Take, for example, the arrangement shown in FIG. 2D, which is the same as that of FIG. 2A except that here switch S1 is driven by the complement of Pulse$_m$ and switch S3 is driven by Pulse$_m$. Therefore, here, for Sense$_m$ to fall when the pulse width of Pulse$_m$ is equal to or less than m/k of the pulse width of CKref, the magnitude of Ipulse would be set to be Iref/(1−m/k) plus the trim current. Similarly, the arrangement shown in FIG. 3B is the same as that of FIG. 3A except that here switch S1 is driven by the complement of Pulse$_m$ and switch S2 is driven by Pulse$_m$, and the magnitude of Ipulse would also be set to Iref/(1−m/k) plus the trim current.

Figure 4B:
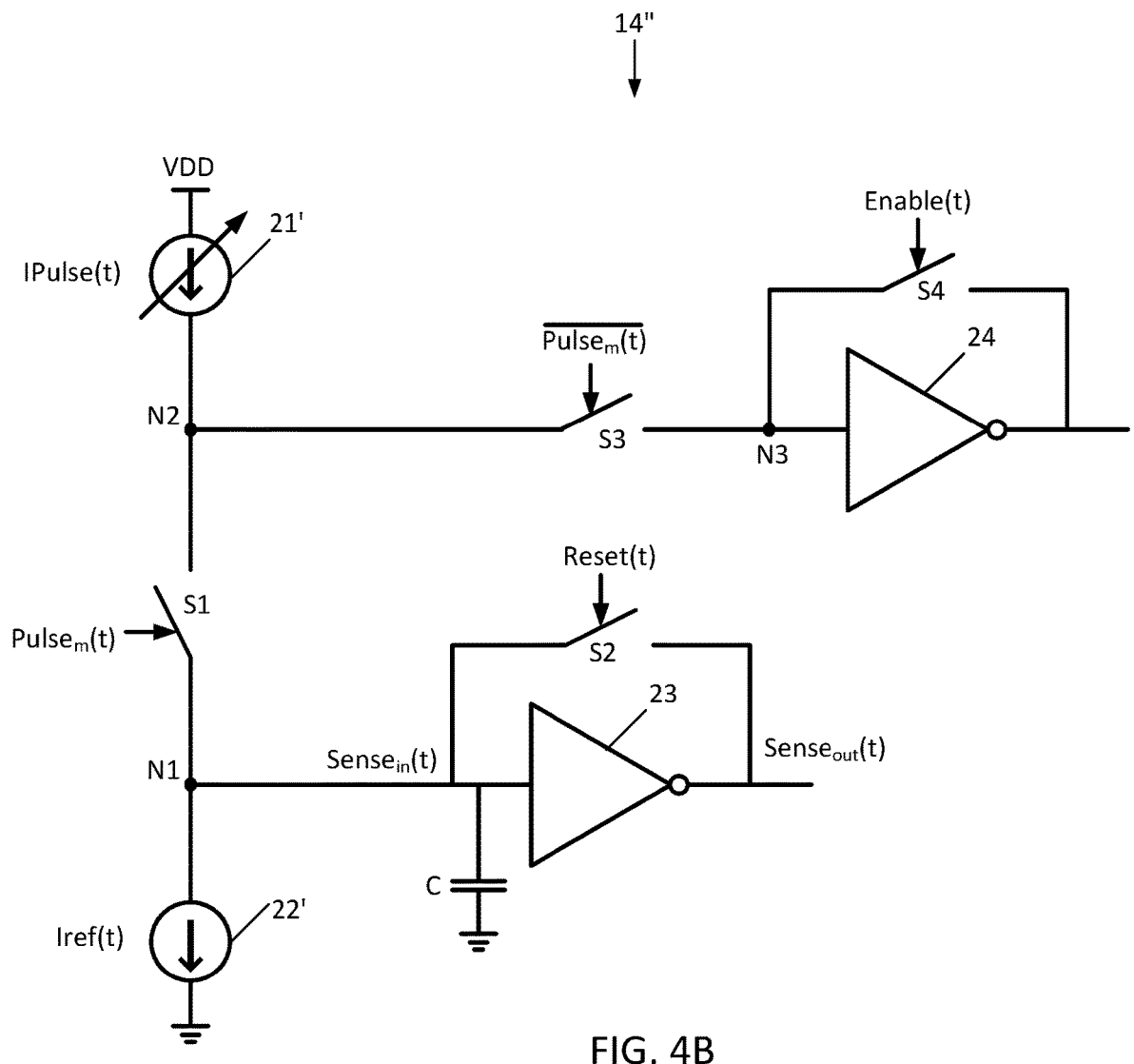
FIG. 4B is a schematic block diagram of the third embodiment of the pulse width check circuit of FIG. 3A in which the driving of switches S1 and S3 has been reversed.

As another example of this, see the arrangement of FIG. 4B, which is the same as that of FIG. 4A, except that switch S1 is driven by Pulse$_m$ and switch S3 is driven by the complement of Pulse$_m$, and the magnitude of Ipulse would be set to be (m/k)*Iref minus the trim current. A sample variable current source 22 such as may be used with the embodiments of FIGS. 2A and 3 is now described with reference to FIG. 5. The current source 22 includes a current generator 30 producing a current identical to the Iref current described above. The current generator 30 is selectively coupled to the drain of NMOS transistor MN1 via switch Scs0, and is directly coupled to the gates of NMOS transistors MN2, MN4, MN6, . . . , MNn (described below).

The NMOS transistor MN1 has its drain coupled to the switch Scs0, its source coupled to the drain of NMOS transistor MN2, and its gate tied to a cascode voltage sufficient to keep the NMOS transistors MN1 and MN2 turned on in saturation. NMOS transistor MN2 has its drain coupled to the source of NMOS transistor MN1, its source coupled to ground, and its gate coupled to the current source 30.

NMOS transistor MN3 has its drain selectively coupled to the common node by switch Scs1 to assist with generating the IPulse current, its source coupled to the drain of NMOS transistor MN4, and its gate coupled to a cascode voltage sufficient to keep the NMOS transistors MN3 and MN4 turned on in saturation. NMOS transistor MN4 has its drain coupled to the source of NMOS transistor MN3, its source coupled to ground, and its gate coupled to the current source 30.

NMOS transistor MN5 has its drain selectively coupled to the common node by switch Scs2 to assist with generating the IPulse current, its source coupled to the drain of NMOS transistor MN6, and its gate coupled to a cascode voltage sufficient to keep the NMOS transistors MN5 and MN6 turned on in saturation. NMOS transistor MN6 has its drain coupled to the source of NMOS transistor MN5, its source coupled to ground, and its gate coupled to the current source 30.

Note that the variable current source 22 may include any number of transistors and switches in the same arrangement as Scs1/MN3/MN4 and Scs2/MN5/MN6, and therefore to represent this and the final transistor pair in the chain, the variable current source 22 is shown as including NMOS transistors MNn1 and MNn2. NMOS transistor MNn1 has its drain selectively coupled to the common node by switch Scsn to assist with generating the IPulse current, its source coupled to the drain of NMOS transistor MNn2, and its gate coupled to a cascode voltage sufficient to keep the NMOS transistors MNn1 and MNn2 turned on in saturation. NMOS transistor MNn2 has its drain coupled to the source of NMOS transistor MNn1, its source coupled to ground, and its gate coupled to the current source 30.

In operation, the switch Scs0 is closed at all times (unless it is desired for the variable current source 22 to turn off, in which case the switch Scs0 would open), and the number of the switches Scs1, Scsn closed will depend upon the value of K/m to thereby generate the IPulse current as variable and having a magnitude equal to that of Iref*(K/m).

Although the variable current source 22 is shown as being drawn with NMOS transistors, it should be understood that instead PMOS transistors could be used, and those of skill in the art will understand how to adapt the variable current source 22 to this arrangement.

Figure 5:
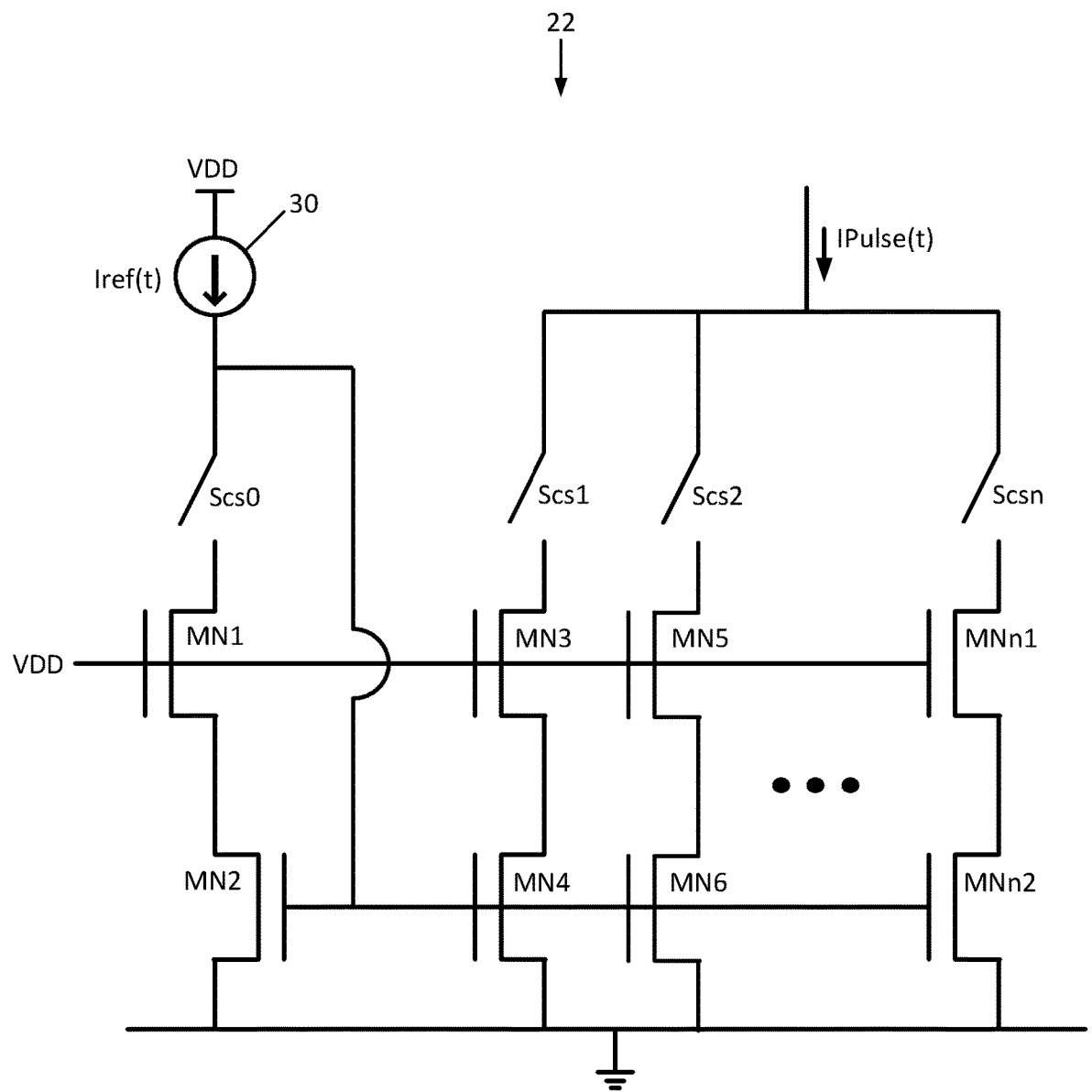
FIG. 5 is a schematic diagram of a variable current source for use the current generator 22 in FIGS. 2A, 2D and 3A, 3B, or for use as the current generator 21 in FIGS. 4A, 4B.

Although the structure of the variable current source 22 is shown in FIG. 5, it should be understood that any sort of suitable variable current source 22 (or 21' in the example of FIG. 4) may be used, and this disclosure is not limited to the design of FIG. 5.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A pulse width detector, comprising:
   a first current source coupled to a first node;
   a second current source coupled to a second node;
   a first switch selectively coupling the first node to the second node in response to a pulsed signal having a pulse width configured to be equal to a given fraction of a pulse width of a reference clock; and
   a comparison circuit coupled to the first node and configured to determine whether a total current output by the first current source during a plurality of pulses of the reference clock exceeds a total current output by the second current source during a plurality of pulses of the pulsed signal equal in number to the plurality of pulses of the reference clock.

2. The pulse width detector of claim 1, wherein the first switch closes in response to assertion of the pulsed signal; wherein a magnitude of the total current output by the first current source is a reference magnitude; and wherein a magnitude of the total current output by the second current source is equal to the reference magnitude divided by the given fraction, less a trimming current.

3. The pulse width detector of claim 2, wherein the given fraction is equal to a factor m/K, with m and K being selectable.

4. The pulse width detector of claim 1,
   wherein a determination that the total current output by the first current source during the plurality of pulses of the reference clock exceeds the total current output by the second current source during the plurality of pulses of the pulsed signal equal in number to the plurality of pulses of the reference clock indicates that the pulse width of the pulsed signal is less than or equal to the given fraction of the pulse width of the reference clock; and wherein a determination that the total current output by the first current source during the plurality of pulses of the reference clock is less than the total current output by the second current source during the plurality of pulses of the pulsed signal equal in number to the plurality of pulses of the reference clock indicates that the pulse width of the pulsed signal is greater than the given fraction of the pulse width of the reference clock.

5. The pulse width detector of claim 1, wherein the comparison circuit is further configured to assert a fault signal in response to the pulse width of the pulsed signal being greater than the given fraction of the pulse width of the reference clock, or to assert a fault signal in response to the pulse width of the pulsed signal being greater than the given fraction of the pulse width of the reference clock a given number of times.

6. The pulse width detector of claim 1, wherein the comparison circuit comprises:
 a capacitor coupled between the first node and ground;
 an inverter having an input coupled to the first node, and having an output;
 a second switch selectively coupling the input of the inverter to the output of the inverter in response to a reset signal;
 wherein, in a reset mode of the comparison circuit, the reset signal is asserted to close the second switch to set the input and output of the inverter to a threshold voltage of the inverter;
 wherein, in a sensing mode of the comparison circuit, the reset signal is deasserted to open the second switch such that the output of the inverter generates an output voltage based upon a voltage at the first node;
 a third switch selectively coupling the second node to a third node in response to an inverse of the pulsed signal; and
 a reference voltage generation circuit configured to generate a reference voltage as a function of a voltage at the third node;
 wherein the reference voltage generation circuit comprises an inverter having an input coupled to the third node and an output producing the reference voltage; and
 wherein the generation of the reference voltage by the inverter serves to maintain voltage biasing across the second current source.

7. The pulse width detector of claim 1, wherein the comparison circuit comprises:
 an inverter having an input coupled to the first node, and having an output;
 a capacitor coupled between the input of the inverter and the output of the inverter; and
 a second switch selectively coupling the input of the inverter to the output of the inverter in response to a reset signal;
 wherein, in a reset mode of the comparison circuit, the reset signal is asserted to close the second switch to set the input and output of the inverter to a threshold of the inverter; and
 wherein, in a sensing mode of the comparison circuit, the reset signal is deasserted to open the second switch such that the output of the inverter generates an output voltage based upon a voltage at the first node.

8. A circuit, comprising:
 a delay locked loop configured to receive a reference clock signal and produce therefrom a plurality of delayed versions of the reference clock signal, each delayed version of the reference clock signal being delayed by a different multiple of a same given fraction of a pulse width of the reference clock signal;
 a pulse decoder configured to receive an input code and the plurality of delayed versions of the reference clock signal, and to produce therefrom a pulsed signal, the pulsed signal configured to have a pulse width equal to the input code multiplied by the given fraction of the pulse width of the reference clock signal; and
 a pulse width detector configured to receive the pulsed signal and determine whether the pulse width of the pulsed signal is actually equal to the input code multiplied by the given fraction of the pulse width of the reference clock signal.

9. The circuit of claim 8, wherein the pulse width detector comprises:
 a first current source coupled to a first node;
 a second current source coupled to a second node;
 a first switch selectively coupling the first node to the second node in response to the pulsed signal;
 a capacitor coupled between the first node and ground;
 an inverter having an input coupled to the first node, and having an output;
 a second switch selectively coupling the input of the inverter to the output of the inverter in response to a reset signal;
 a third switch selectively coupling the second node to a third node in response to an inverse of the pulsed signal; and
 an inverter having an input coupled to the third node.

10. The circuit of claim 8, wherein the pulse width detector comprises:
 a first current source coupled to a first node;
 a second current source coupled to a second node;
 a first switch selectively coupling the first node to the second node in response to the pulsed signal;
 an inverter having an input coupled to the first node, and having an output;
 a capacitor coupled between the input and the output of the inverter;
 a second switch selectively coupling the input of the inverter to the output of the inverter in response to a reset signal;
 a third switch selectively coupling the second node to a third node in response to an inverse of the pulsed signal; and
 an inverter having an input coupled to the third node.

11. A circuit, comprising:
 a first current source coupled to a first node;
 a second current source coupled to a second node;
 a first switch selectively coupling the first node to the second node in response to a pulsed signal;
 an inverter having an input coupled to the first node, and having an output;
 a capacitor coupled to the input of the inverter;
 a second switch selectively coupling the input of the inverter to the output of the inverter in response to a reset signal;
 a third switch selectively coupling the second node to a third node in response to an inverse of the pulsed signal; and
 an inverter having an input coupled to the third node.

12. The circuit of claim 11, wherein the capacitor is coupled between the input of the inverter and the output of the inverter, or coupled between the input of the inverter and ground.

13. A method, comprising:
configuring a first current source to generate a reference current having a reference magnitude;
configuring a second current source to generate a comparison current having a magnitude equal to the reference current divided by a given fraction of a pulse width of a reference clock;
configuring the first current source to continuously source current to a comparison node;
configuring the second current source to sink current from the comparison node during each pulse of a pulsed signal having a pulse width configured to be equal to the given fraction of the pulse width of the reference clock; and
determining whether the pulse width of the pulsed signal is actually equal to the given fraction of the pulse width of the reference clock by determining whether a total current output by the first current source during a plurality of pulses of the reference clock exceeds a total current output by the second current source during a plurality of pulses of the pulsed signal equal in number to the plurality of pulses of the reference clock.

14. The method of claim 13,
wherein a determination that the total current output by the first current source during the plurality of pulses of the reference clock exceeds the total current output by the second current source during the plurality of pulses of the pulsed signal equal in number to the plurality of pulses of the reference clock indicates that the pulse width of the pulsed signal is less than or equal to the given fraction of the pulse width of the reference clock; and
wherein a determination that the total current output by the first current source during the plurality of pulses of the reference clock is less than the total current output by the second current source during the plurality of pulses of the pulsed signal equal in number to the plurality of pulses of the reference clock indicates that the pulse width of the pulsed signal is greater than the given fraction of the pulse width of the reference clock.

15. A circuit, comprising:
a first current source coupled to a first node;
a second current source coupled to a second node;
a first switch selectively coupling the first node to the second node in response to a pulsed signal;
an inverter having an input coupled to the first node, and having an output;
a capacitor coupled to the input of the inverter;
a second switch selectively coupling the input of the inverter to the output of the inverter in response to a reset signal;
a third switch selectively coupling the second node to a third node in response to an inverse of the pulsed signal; and
an inverter having an input coupled to the third node.

16. The circuit of claim 15, wherein the capacitor is coupled between the input of the inverter and the output of the inverter, or coupled between the input of the inverter and ground.

17. A pulse width detector, comprising:
a first current source coupled to a first node;
a second current source coupled to a second node;
a first switch selectively coupling the first node to the second node in response to a complement of a pulsed signal having a pulse width configured to be equal to a given fraction of a pulse width of a reference clock; and
a comparison circuit coupled to the first node and configured to determine whether a total current output by the first current source during a plurality of pulses of the reference clock exceeds a total current output by the second current source during complements of a plurality of pulses of the pulsed signal equal in number to the plurality of pulses of the reference clock.

18. The pulse width detector of claim 17, wherein the first switch closes in response to deassertion of the pulsed signal; wherein a magnitude of the current output by the first current source is a reference magnitude; and wherein a magnitude of the current output by the second current source is equal to the reference magnitude divided by one minus the given fraction, plus a trimming current.

19. The pulse width detector of claim 17,
wherein a determination that the total current output by the first current source during the plurality of pulses of the reference clock is less than the total current output by the second current source during complements of the plurality of pulses of the pulsed signal equal in number to the plurality of pulses of the reference clock indicates that the pulse width of the pulsed signal is less than or equal to the given fraction of the pulse width of the reference clock; and
wherein a determination that the total current output by the first current source during the plurality of pulses of the reference clock is greater than the total current output by the second current source during complements of the plurality of pulses of the pulsed signal equal in number to the plurality of pulses of the reference clock indicates that the pulse width of the pulsed signal is greater than the given fraction of the pulse width of the reference clock.

20. The pulse width detector of claim 17, wherein the comparison circuit comprises:
a capacitor coupled between the first node and ground;
an inverter having an input coupled to the first node, and having an output;
a second switch selectively coupling the input of the inverter to the output of the inverter in response to a reset signal;
wherein, in a reset mode of the comparison circuit, the reset signal is asserted to close the second switch to set the input and output of the inverter to a threshold voltage of the inverter;
wherein, in a sensing mode of the comparison circuit, the reset signal is deasserted to open the second switch such that the output of the inverter generates an output voltage based upon a voltage at the first node;
a third switch selectively coupling the second node to a third node in response to the pulsed signal; and
an inverter having an input coupled to the third node and an output generating a reference voltage, wherein the generation of the reference voltage by the inverter serves to maintain voltage biasing across the first current source.

21. The pulse width detector of claim 17, wherein the comparison circuit comprises:
an inverter having an input coupled to the first node, and having an output;
a capacitor coupled between the input of the inverter and the output of the inverter; and a second switch selectively coupling the input of the
inverter to the output of the inverter in response to a
reset signal;
wherein, in a reset mode of the comparison circuit, the
reset signal is asserted to close the second switch to set
the input and output of the inverter to a threshold of the
inverter; and
wherein, in a sensing mode of the comparison circuit, the
reset signal is deasserted to open the second switch
such that the output of the inverter generates an output
voltage based upon a voltage at the first node.

* * * * *

UNITED STATES PATENT AND TRADEMARK OFFICE
CERTIFICATE OF CORRECTION

PATENT NO. : 12,149,047 B2  
APPLICATION NO. : 17/833604  
DATED : November 19, 2024  
INVENTOR(S) : Marco Zamprogno et al.

Page 1 of 1

It is certified that error appears in the above-identified patent and that said Letters Patent is hereby corrected as shown below:

In the Specification

At Column 3, Line 53, [[ $Sense_m$ ]] should be corrected to read -- $Sense_{in}$ --.

At Column 4, Line 9, [[ Sense ]] should be corrected to read -- $Sense_{in}$ --.

At Column 4, Line 12, [[ Sense ]] should be corrected to read -- $Sense_{in}$ --.

At Column 4, Line 18, [[ Sense ]] should be corrected to read -- $Sense_{in}$ --.

At Column 4, Line 51, [[ $Sense_m$ ]] should be corrected to read -- $Sense_{in}$ --.

At Column 5, Line 22, [[ Sense ]] should be corrected to read -- $Sense_{in}$ --.

At Column 5, Line 24, [[ Sense ]] should be corrected to read -- $Sense_{in}$ --.

At Column 5, Line 30, [[ Sense ]] should be corrected to read -- $Sense_{in}$ --.

At Column 5, Line 31, [[ Sense ]] should be corrected to read -- $Sense_{in}$ --.

Signed and Sealed this  
Tenth Day of February, 2026

John A. Squires  
*Director of the United States Patent and Trademark Office*